United States Patent [19]
Tachikawa et al.

[11] Patent Number: 5,438,951
[45] Date of Patent: Aug. 8, 1995

[54] METHOD OF GROWING COMPOUND SEMICONDUCTOR ON SILICON WAFER

[75] Inventors: Akiyoshi Tachikawa; Aiji Jono; Takashi Aigo; Akihiro Moritani, all of Sagamihara, Japan

[73] Assignee: Nippon Steel Corporation, Japan

[21] Appl. No.: 169,204

[22] Filed: Dec. 20, 1993

[30] Foreign Application Priority Data

Dec. 21, 1992 [JP] Japan .................. 4-357208
Dec. 21, 1992 [JP] Japan .................. 4-357209

[51] Int. Cl.⁶ ............................................. C30B 25/02
[52] U.S. Cl. ............................. 117/84; 117/90; 117/105; 437/126
[58] Field of Search .............. 117/4, 10, 43, 84, 90, 117/97, 104, 105, 906, 935; 437/126

[56] References Cited

U.S. PATENT DOCUMENTS 4,876,219 10/1989 Eshita et al. ............... 437/126
4,910,167 3/1990 Lee et al. .................... 117/97
5,144,379 9/1992 Eshita et al. ............... 357/22
5,244,820 9/1993 Kamata et al. .............. 437/20

FOREIGN PATENT DOCUMENTS 61-26216 2/1986 Japan .
61-70715 4/1986 Japan .
62-189720 8/1987 Japan .
WOA8904551 of 1989 WIPO .

OTHER PUBLICATIONS

Fujita, et al., Effect of Pre-Growth Treatment of Si Substrates on GaAs Growth on Si by MOCVD, The Sumitomo Search, No. 47, Oct., 1991, pp. 22-32.

Fujita, et al., AsH₃ preflow effects on initial states of GaAs grown on Si by metalorganic chemical vapor deposition, Appl. Phy. Lett. 59(26), Dec., 1991, pp. 3458-3460.

Ohori, et al., A novel method for HEMT-on-Si by MOVPE, Inst. Phys. Conf. Ser. No. 129, Chapter 3, 1993, pp. 175-180.

Kaminishi, GaAs on Si Technology, Solid State Technology, vol. 30, No. 11, (1987), pp. 91-97.

Primary Examiner—R. Bruce Breneman
Assistant Examiner—Felisa Garrett
Attorney, Agent, or Firm—Pollock, Vande Sande & Priddy

[57] ABSTRACT

A technique of heteroepitaxially growing compound semiconductor on a silicon wafer, which can simplify the growth sequence, and improve the productivity and the surface morphology of a growth film. In growing compound semiconductor on a silicon wafer, the growth sequence such as shown in FIG. 1 is used. A necessary thin buffer layer is continuously grown at the temperature raising period up to the crystal growth temperature. Therefore, an independent process of growing a buffer layer at a lower temperature is not necessary, and the surface morphology is also improved by this method of growing compound semiconductor on a silicon wafer.

7 Claims, 6 Drawing Sheets

AMORPHOUS GaAs ( LAYER A )

RE-CRYSTALLIZED LAYER A ( LAYER B )

AMORPHOUS GaAs ( LAYER C )

LAYER B WITH NEWLY RE-CRYSTALLIZED AMORPHOUS GaAs

RE-CRYSTALLIZED LAYER C AROUND NEW NUCLEI

////  AMORPHOUS GaAs

////  RE-CRYSTALLIZED GaAs

METHOD OF GROWING COMPOUND SEMICONDUCTOR ON SILICON WAFER

BACKGROUND OF THE INVENTION

1. Field of the Invention

The present invention relates to a method of epitaxially growing compound semiconductor on a silicon wafer.

2. Description of the Related Art

With a conventional method of epitaxially growing compound semiconductor such as two-element semiconductor on a wafer made of single-element such as Si, there are formed a defect called an anti-phase domain because different atoms are arranged on the same plane and a number of crystal defects called dislocation caused by a difference between lattice constants and thermal expansion factors inherent to heteroepitaxy. In order to solve such problems, a method called a two-step growth method is generally used in growing compound semiconductor, which is disclosed in JP-A-61-26216 and JP-A-61-70715. FIG. 7 illustrates a supply of source materials and a temperature change of a susceptor according to the two-step growth method. For the comparison with FIG. 7, a supply of source materials and a temperature change of a susceptor according to homoepitaxy used for forming a compound semiconductor is shown in FIG. 6. A conventional two-step growth method will be described with reference to FIGS. 7, 8A, and 8B. First, a silicon wafer is cleaned which has the surface inclined by 2 to 5 degrees in the direction <1 1 0> from the plane (0 0 1). The surface oxide film of the wafer is first exposed to hydrofluoric acid to etch it, and then subjected to a thermal treatment under a hydrogen atmosphere at a temperature of 800° C. or higher within a compound semiconductor manufacturing apparatus to completely remove the surface oxide film (Step (1)). Next, after the temperature is lowered to about 450° C., source material gasses are introduced into the apparatus to deposit amorphous compound semiconductor to a thickness of 20 to 200 nm (Step (2)). Thereafter, the temperature is raised to about 650° to 700° C. (Step (3)). During this temperature raising period, the amorphous compound semiconductor changes to a single crystal layer. By using the single crystal layer as a buffer layer, compound semiconductor is grown on it (Step (4)).

Specifically, in growing GaAs compound semiconductor, a thin amorphous layer is first formed (FIG. 8A) which is re-crystallized during the temperature raising period to form a buffer layer of a poor surface flatness (FIG. 8B). Since a growth layer is formed on such a buffer layer, from the viewpoint of surface morphology, the growth layer has a waved surface characteristic of GaAs/Si without reflecting the flatness of the silicon wafer. This uneven surface adversely affects the distribution of threshold values of LSIs. A report regarding this issue was presented at the Spring Meeting of the Japan Society of Applied Physics, 1992. This report teaches that the surface flatness can be improved if the growth is temporarily terminated under the uneven surface condition, and it is resumed after the surface is polished to the degree of the same flatness as the silicon wafer.

The first problem associated with the above-described conventional technique is that the productivity is very low as compared to the homoepitaxy illustrated in FIG. 6, because the second-step growth method requires the four steps, including a step of cleaning the surface of a wafer, a step of setting a temperature suitable for the deposition of an amorphous layer, a step of raising the temperature suitable for crystallizing the amorphous layer into a buffer layer, and a step of setting the temperature suitable for growing compound semiconductor. The second problem resides in the verification that because the amorphous layer is as thin as 200 nm or less, the single crystal layer crystallized during the temperature raising period is not two-dimensionally continuous but is formed by many islands and does not cover the whole surface of the silicon wafer (The Sumitomo Search No. 47, October 1991, Applied Physic Letter 59 (26), 23 Dec. 1991).

As above, from the viewpoint of surface morphology, the surface of an epitaxial film grown by the two-step growth method is rough. With this conventional technique, the root mean square roughness is 4 to 5 nm even in an excellent case according to the evaluation by AFM (Atomic Force Microscopy). This conventional technique can be therefore said still not practical when considering a roughness of 3 nm at a minimum required for an LSI level. Although the re-growth method after polishing which attains an improved surface flatness of an LSI level, has been tried (GaAs and Related Compounds, 1992, Karuizawa, Inst. Phys. Ser. No. 129, Chapter 3, p. 175), the number of necessary manufacturing steps increases considerably, the productivity lowers, and the manufacturing cost becomes high. It has been long desired therefore to provide an as-grown wafer to have a surface flatness of about 3 nm comparable with an LSI level.

The surface roughness will further be detailed. In growing a single crystal compound semiconductor of a single domain on a silicon wafer by a conventional two-step growth method, a buffer layer of compound semiconductor as thin as 200 nm or less changes, during the temperature raising period (Step 2) shown in FIG. 7, from a thin amorphous continuous film shown in FIG. 8A to re-crystallized as single crystal compound semiconductor of single domain islands shown in FIG. 8B. However, the density of this single crystal buffer layer is more coarse than an ordinary single crystal. Furthermore, because only the small amount of source materials corresponding to the thin amorphous buffer layer is used and because re-crystallization starts from the location having a small growth energy, nuclei grow large at atomic level steps called a kink in the direction <0 0 1> dominant over other directions on the silicon wafer surface. In other words, a two-dimensional lateral growth improving the flatness is difficult so that the finished buffer layer cannot fully cover the whole surface of the silicon wafer. Compound semiconductor grown on the buffer layer reflects the inferior flatness of the layer, and other layers grown on the compound semiconductor layer also reflect it. If the buffer layer is made thicker in order to replenish source materials, rearrangement of crystals is hindered much, forming whity single crystal layer with an anti-phase domain instead of a layer with a single domain. From the above reasons, the conventional growth technique is not suitable for growing compound semiconductor on a silicon wafer having a surface flatness comparable with LSI level electronic devices.

SUMMARY OF THE INVENTION

It is therefore an object of the present invention to simplify the additional process of the conventional technique and improve the surface morphology without deteriorating the crystal property.

In order to achieve the above object of the present invention, there is provided a method of epitaxially growing compound semiconductor on a silicon wafer, in which an amorphous buffer layer is grown on a clean silicon wafer not at a constant temperature as in the case of the conventional technique, but during a temperature raising period, from a temperature allowing source materials necessary for the growth of the compound semiconductor to be dissolved, to a temperature allowing the growth of single crystal of the compound semiconductor. Accordingly, the buffer layer having an excellent coverage of the silicon wafer which leads to an improved surface flatness can be obtained, and very simplified processes can be realized.

DESCRIPTION OF THE PREFERRED EMBODIMENTS

Preferred embodiments of the present invention will be described with reference to the accompanying drawings. In the following embodiments, a gallium arsenide layer is grown by a vapor deposition method particularly by MOCVD, by using a Si wafer. Calibration of a growth temperature was carried out by measuring a melting point of aluminum particles placed on a wafer.

Figure 1:
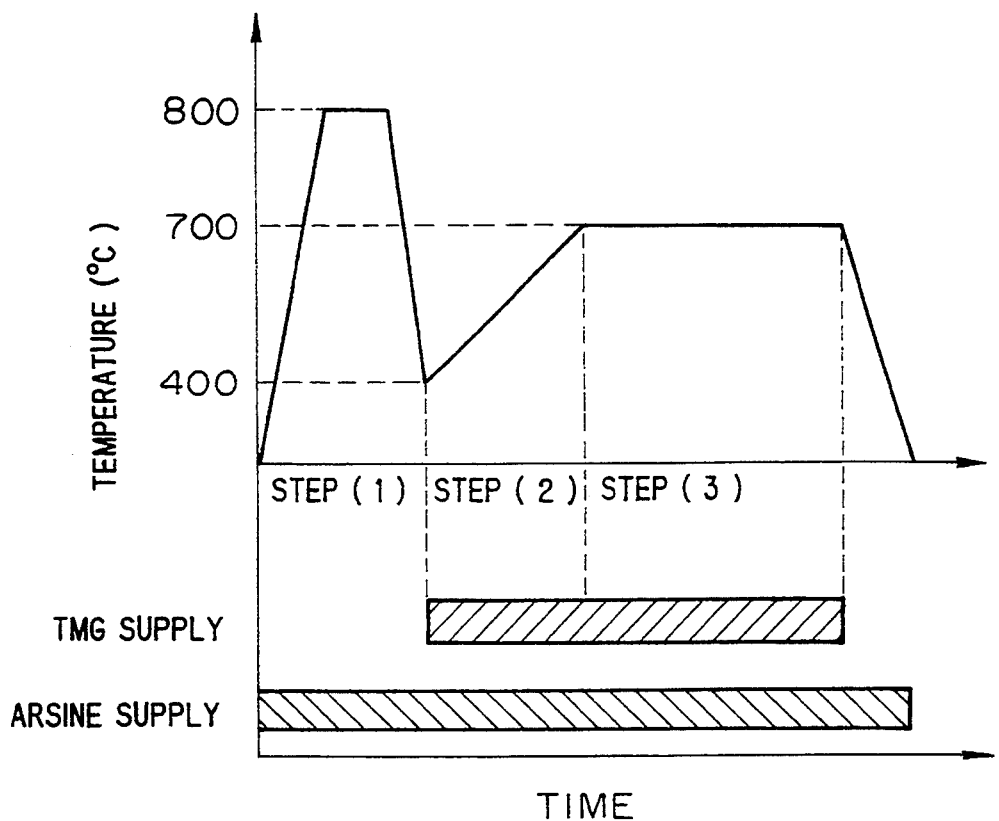
FIG. 1 is a graph illustrating a temperature change of a susceptor and a supply of source materials according to a first embodiment of a method of manufacturing a compound semiconductor of the present invention.

FIG. 1 is a graph illustrating a temperature change of a susceptor and a supply of source materials according to the first embodiment of a method of manufacturing a compound semiconductor of the present invention. In the following description, a term "temperature" is intended to mean the temperature of a susceptor.

Referring to FIG. 1, at Step (1), a silicon wafer having the surface tilted by 3 degrees in the direction <1 1 0> from the plane (0 0 1) is subjected to a surface cleaning process for 5 minutes at a temperature of 800° C. or higher under a hydrogen carrier gas. Thereafter, at Step (2), one of source materials, trimethylgallium (TMG), is introduced into a reaction furnace starting at a temperature of 400° C. not allowing gallium arsenide to be crystallized. The temperature is thereafter raised to 600° to 750° in 4 to 8 minutes. The temperature range from 600° to 750° C. is suitable for a single crystal growth temperature. During the temperature raising period of 4 to 8 minutes, a buffer layer is formed to a thickness from 100 nm or more to 250 nm or less (the buffer layer formed during this temperature raising period is called hereinafter a temperature raising growth layer). At the temperature from 600° to 750° C., the source material is continuously supplied (Step (3)) until a desired film thickness is obtained when the supply of the source material is stopped. Another source material, arsine, is preferably supplied at all Steps in order to prevent attachment of impurities from the susceptor, and re-vaporization of As.

Figure 2A:
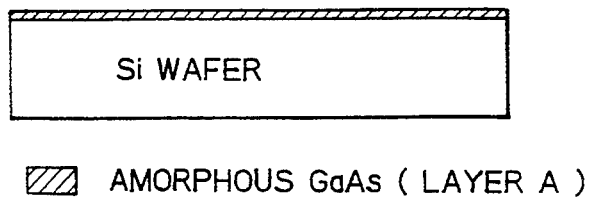
FIGS. 2A to 2C are schematic diagrams showing the surface states at Step (2) of the manufacturing method explained with FIG. 1, from the viewpoint of morphology.
Figure 2B:
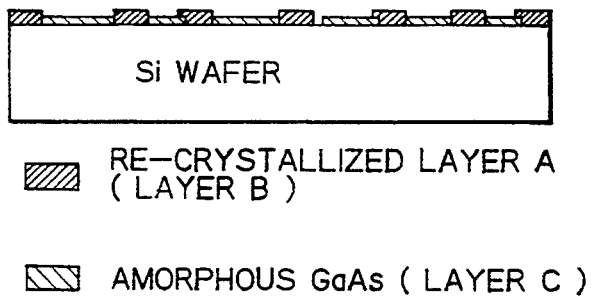
Figure 2C:
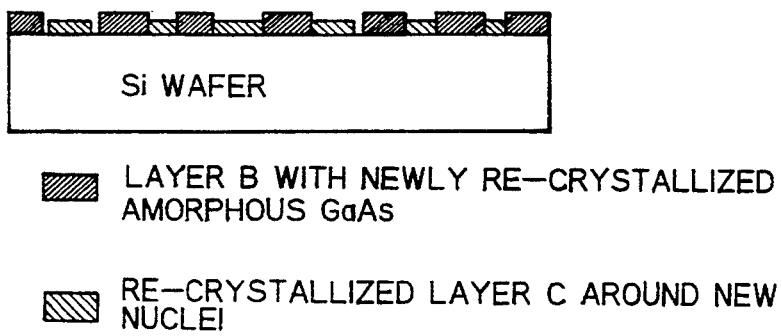
Figure 8A:
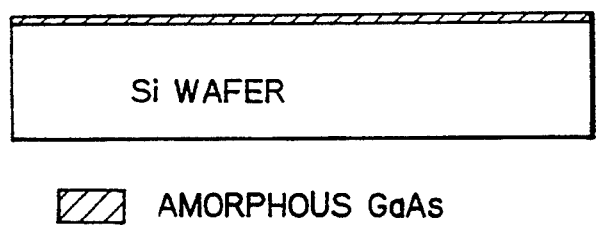
FIGS. 8A and 8B are schematic diagrams showing the surface states at Steps (2) and (3) of the manufacturing method explained with FIG. 7, from the viewpoint of surface morphology.
Figure 8B:
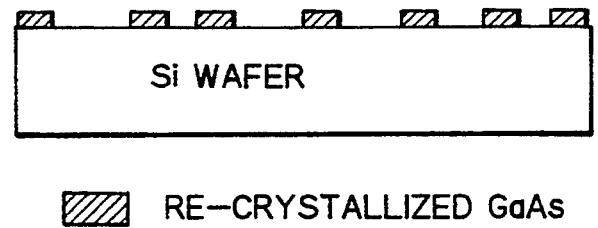

FIGS. 2A to 2C provide both the growth of the amorphous buffer layer mainly at the lower temperature and the re-crystallization of the amorphous material during the temperature raising period. Accordingly, not only a single crystal of compound semiconductor with a single domain can be grown, but also a silicon wafer fully covered with the temperature raising growth layer can be obtained. Because the source material is continuously supplied in the temperature range within which both the re-crystallization of already deposited amorphous material (layer B shown in FIG. 2B) and the growth of new amorphous material (layer C in FIG. 2B) are carried out, the surface of the silicon wafer not completely covered with the single crystal layer shown in FIG. 8B is covered with the newly supplied source material (layer C) as shown in FIG. 2B. When the temperature reaches the higher temperature range allowing only the single crystal growth, the coverage of the silicon wafer surface becomes almost 100% as shown in FIG. 2C, with the temperature raising growth layer of an excellent surface flatness being formed. A single crystal growth layer formed on the temperature raising growth layer has an excellent surface as small as a root mean square roughness of 3 nm or less measured by AFM, which allows electronic devices at an LSI level to be manufactured.

Furthermore, as compared to the two-step growth method, an independent process of growing a buffer layer at the low temperature is not needed. With the embodiment method, an as-grown wafer has a surface morphology comparable with an LSI level. The conventional re-growth after polishing is not necessary. With a very simple growth method, it is possible to realize a silicon wafer with a compound semiconductor epitaxial layer having an excellent surface flatness suitable for manufacturing LSIs.

A GaAs/Si heteroepitaxial wafer having an excellent surface flatness (3 nm of a root mean square roughness measured by AFM) can be manufactured easily by the embodiment method having the number of processes less than a conventional method. The crystal property of the epitaxial growth layer having a thickness of 3 $\mu$m was evaluated as having a half-value width of 200 seconds measured by an X ray. The half-value width of a growth film formed by a conventional two-step growth method is 230 seconds. It was verified accordingly that also the crystal property was improved by the embodiment growth method.

Figure 3:
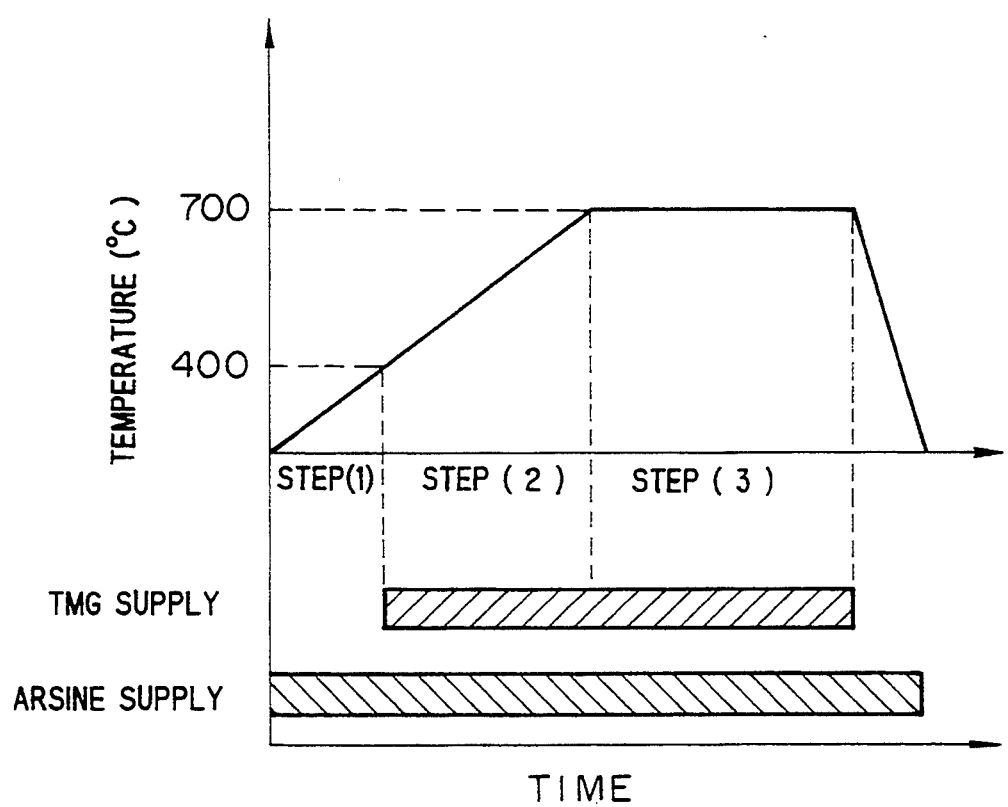
FIG. 3 is a graph illustrating a temperature change of a susceptor and a supply of source materials according to a second embodiment of a method of manufacturing a compound semiconductor of the present invention.

Next, the second embodiment of the present invention will be described with reference to FIG. 3.

A silicon wafer having the surface tilted by three degrees in the direction <1 1 0> from the plane (0 0 1) is annealed at a temperature of 1100° C. under a hydrogen atmosphere in an apparatus other than an MOCVD growth apparatus, and etched by hydrofluoric acid. Thereafter, the silicon wafer is placed on a susceptor of the MOCVD apparatus, taking care of the silicon wafer so as not to be contaminated. Compound semiconductor is grown under the condition of a temperature change and a source material supply illustrated in FIG. 3. Specifically, at Step (2) where the temperature is continuously raised, one of the source materials, TMG, is supplied starting from a temperature of 400° C. The other material, arsine, is preferably supplied at all Steps from the same reason described with the first embodiment. In this manner, a GaAs/Si heteroepitaxial wafer having a desired excellent surface flatness was obtained with the number of processes less than a conventional method. The crystal property of the heteroepitaxial layer formed by the second embodiment was improved to the same extent as the first embodiment.

Figure 4:
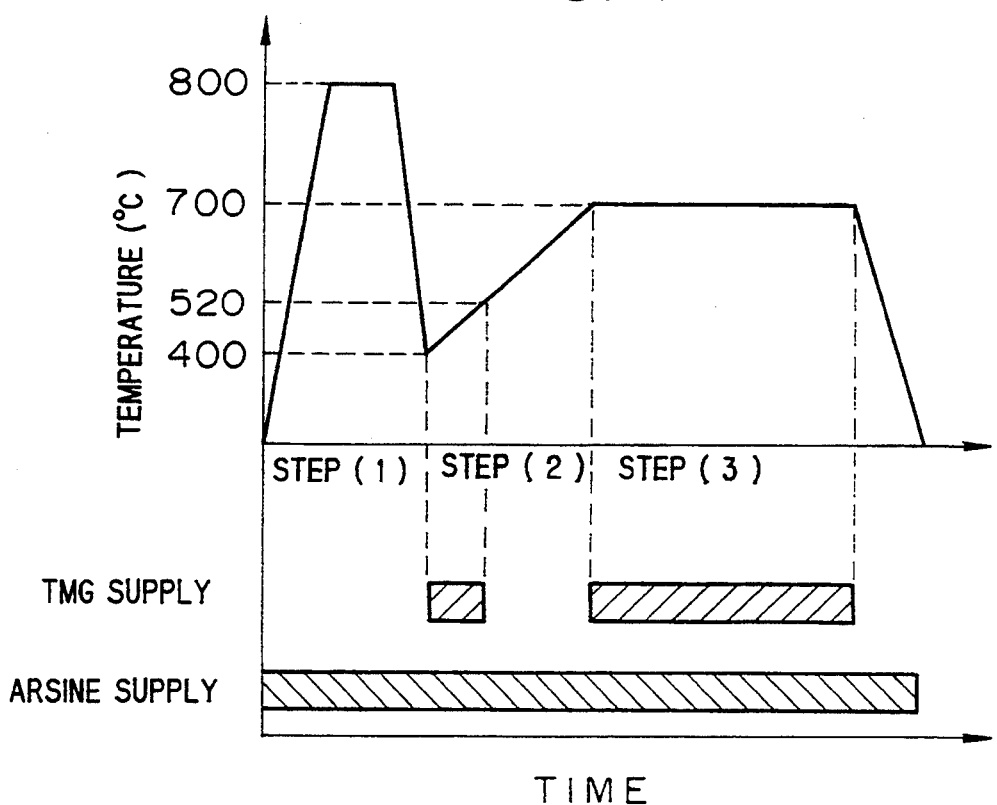
FIG. 4 is a graph illustrating a temperature change of a susceptor and a supply of source materials according to a third embodiment of a method of manufacturing a compound semiconductor of the present invention.

The third embodiment of the present invention will be described with reference to FIG. 4.

The different points from the first embodiment reside in that at the temperature raising Step (2) from 400° C. to 700° C., TMG is supplied for about one minute at the temperature range from 400° to 520° C. to form the temperature raising layer to a thickness of 40 nm, and thereafter, the supply of TMG is stopped. It is preferable to supply arsine continuously from the same reason described with the first embodiment. Next, at Step (3) maintaining the temperature at 700° C., TMG is again supplied to continue the growth of crystal. The other points are the same as the first embodiment. In this manner, a GaAs/Si heteroepitaxial wafer having a desired excellent surface flatness was obtained with the number of processes less than a conventional method. The crystal performance of the heteroepitaxial layer formed by the second embodiment was improved to the same extent as the first embodiment (2 to 3 nm of the root mean square roughness measured by AFM).

Figure 5:
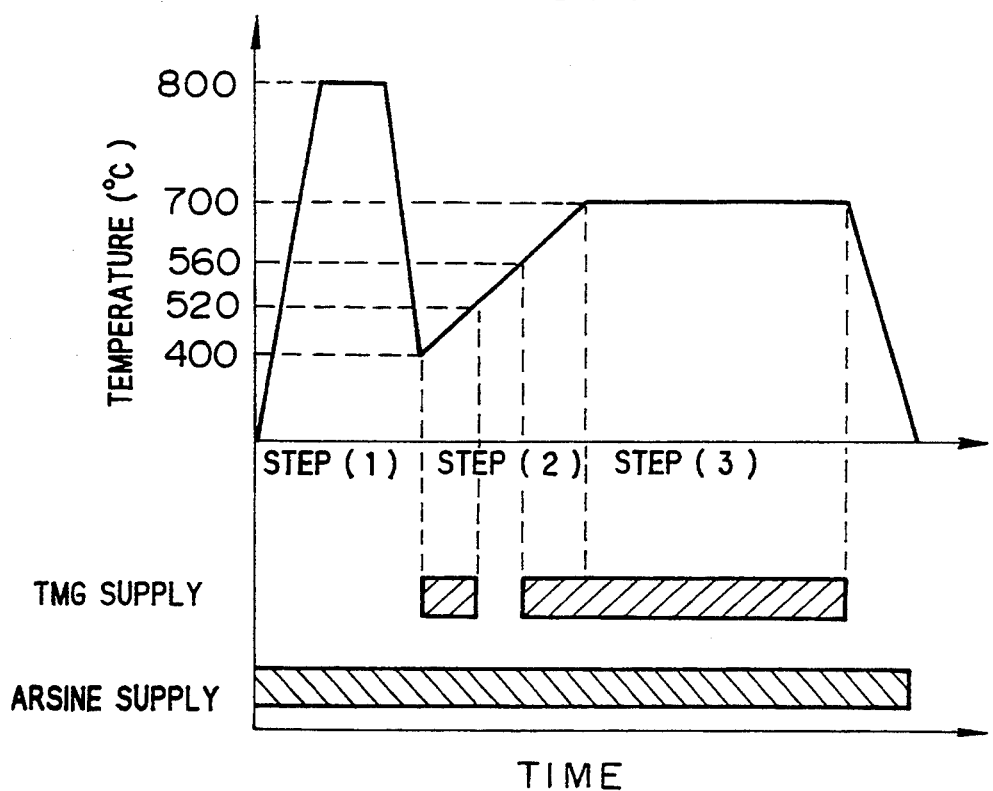
FIG. 5 is a graph illustrating a temperature change of a susceptor and a supply of source materials according to a fourth embodiment of a method of manufacturing a compound semiconductor of the present invention.
Figure 6:
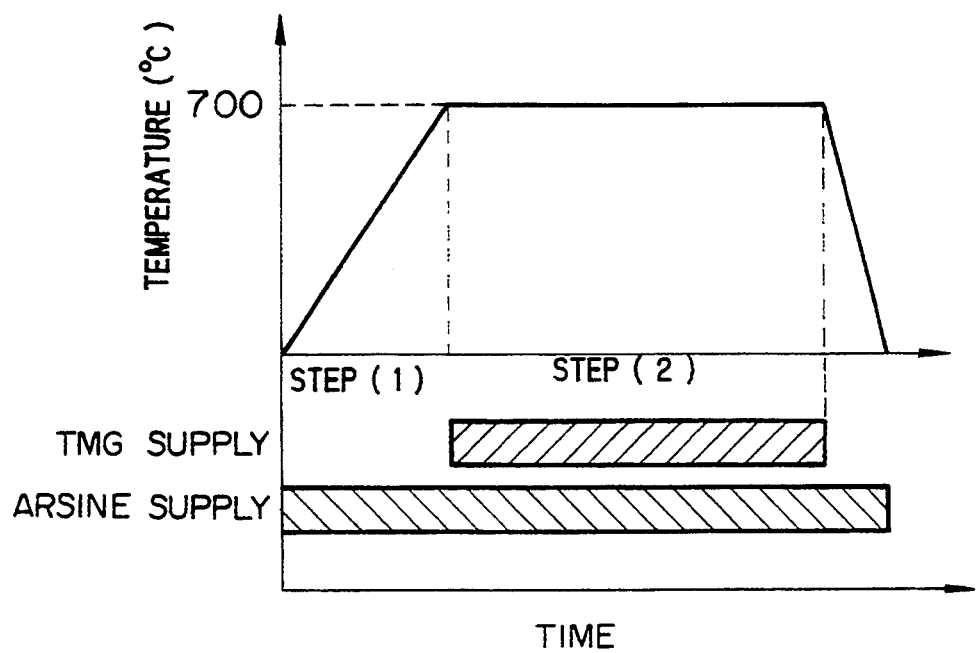
FIG. 6 is a graph illustrating a temperature change of a susceptor and a supply of source materials according to conventional homoepitaxy.
Figure 7:
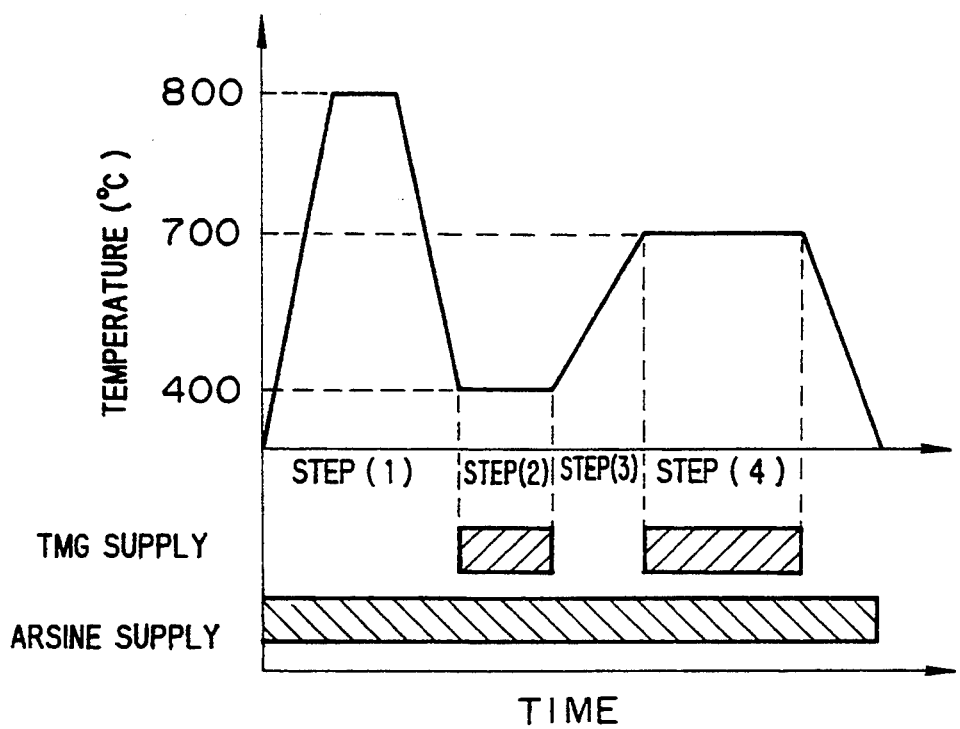
FIG. 7 is a diagram illustrating a temperature change of a susceptor and a supply of source materials according to a conventional two-step growth method.

The fourth embodiment of the present invention will be described with reference to FIG. 5.

The different points from the first embodiment reside in that at the temperature raising Step (2) from 400° C. to 700° C., TMG is not supplied in the temperature range from 520° to 560° C. It is preferable to supply arsine continuously from the same reason described with the first embodiment. The other points are the same as the first embodiment. In this manner, a GaAs/Si heteroepitaxial wafer having a desired excellent surface flatness was obtained with the number of processes less than a conventional method. The crystal performance of the heteroepitaxial layer formed by the second embodiment was improved to the same extent as the first embodiment (2 to 3 nm of the root mean square roughness measured by AFM).

As described so far, according to the present invention, both the complicated growth processes and the poor surface morphology, which have been the issue associated with a conventional two-stage growth method as a technique of heteroepitaxially growing compound semiconductor on a silicon wafer, can be improved, with an improved productivity of GaAs/Si wafers and an improved wafer flatness necessary for IC processes. Furthermore, the crystal property as evaluated from a half-value width of an X-ray can be improved by about 10%, allowing applications not only to electronic devices such as ICs, but also to optoelectronic devices requiring a good crystal property.

What is claimed is:

1. A method of growing an epitaxial film of compound semiconductor on at least one plane of a silicon wafer, comprising the steps of:

forming a buffer layer by continuously raising a temperature of said silicon wafer from a first temperature, at which an amorphous layer of said compound semiconductor can be grown, to a second temperature, at which a single crystal layer of said compound semiconductor can be grown, while supplying all raw materials necessary for the growth of said compound semiconductor, whereby said amorphous layer is grown on said silicon wafer, said amorphous layer is rearranged into a single crystal layer, and said rearranged single crystal layer covers said silicon wafer; and maintaining said silicon wafer formed with said buffer layer at a temperature at which a single crystal layer of said compound semiconductor can be grown, while supplying all raw materials necessary for the growth of said compound semiconductor, whereby a single crystal layer is further grown on said buffer layer.

2. A method according to claim 1, wherein said compound semiconductor is GaAs.

3. A method according to claim 1, wherein the surface of said silicon wafer on which an epitaxial film of said compound semiconductor is grown, is tilted by 2 to 4 degrees in the direction <1 1 0> from the plane (0 0 1), and the method further comprises a step of heating said silicon wafer to a temperature of 800° C. or higher in a hydrogen gas.

4. A method of growing an epitaxial film of compound semiconductor on at least one plane of a silicon wafer, comprising the steps of:

forming a buffer layer by continuously raising a temperature of said silicon wafer from a first temperature, at which an amorphous layer of said compound semiconductor can be grown, to a second temperature, at which a single crystal layer of said compound semiconductor can be grown, while supplying all raw materials necessary for the growth of said compound semiconductor at the temperature range excepting a third temperature range, whereby said amorphous layer is grown on said silicon wafer, said amorphous layer is rearranged into a single crystal layer, and said rearranged into a single crystal layer covers said silicon wafer; and maintaining said silicon wafer formed with said buffer layer at a temperature, at which a single crystal layer of said compound can be grown, while supplying all raw materials necessary for the growth of said compound semiconductor, whereby a single crystal layer is further grown on said buffer layer.

5. A method according to claim 4, wherein said compound semiconductor is GaAs, said first temperature is about 400° C., and said third temperature range is 520° C. or higher.

6. A method according to claim 4, wherein said compound semiconductor is GaAs, said first temperature is about 400° C., and said third temperature range is about from 520° C. to 560° C.

7. A method according to claim 4, wherein the surface of said silicon wafer on which an epitaxial film of said compound semiconductor is grown, is tilted by 2 to 4 degrees in the direction <1 1 0> from the plane (0 0 1), and the method further comprises a step of heating said silicon wafer to a temperature of 800° C. or higher in a hydrogen gas.

* * * * *